(12) United States Patent
Andermo et al.

(10) Patent No.: US 6,304,832 B1
(45) Date of Patent: Oct. 16, 2001

(54) SYMMETRIC SAMPLING

(75) Inventors: Nils Ingvar Andermo; David Skurnik, both of Kirkland; Mark L. Delany, Shoreline, all of WA (US)

(73) Assignee: Mitutoyo Corporation, Kawasaki (JP)

( * ) Notice: Subject to any disclaimer, the term of this patent is extended or adjusted under 35 U.S.C. 154(b) by 0 days.

(21) Appl. No.: 09/268,674

(22) Filed: Mar. 16, 1999

(51) Int. Cl.[7] ..................................................... G06F 19/00
(52) U.S. Cl. ................. 702/189; 324/76.12; 324/207.17; 341/15; 341/114; 375/342
(58) Field of Search .................................. 702/94, 95, 66, 702/69, 70, 75, 79, 125, 150, 152, 163–165, 176–178, 189, 198; 341/15, 111, 114; 324/207.17, 76.12; 375/342

(56) References Cited

U.S. PATENT DOCUMENTS

| | | | |
|---|---|---|---|
| 5,886,519 | * | 3/1999 | Masreliez et al. ............... 324/207.17 |
| 6,005,387 | * | 12/1999 | Andermo et al. ................ 324/207.17 |
| 6,054,851 | * | 4/2000 | Masreliez et al. ............... 324/207.17 |
| 6,137,283 | * | 10/2000 | Williams et al. .................. 324/76.12 |
| 6,208,949 | * | 3/2001 | Eatwell ................................ 702/189 |

OTHER PUBLICATIONS

Fast Generation of Synthetic Nonuniformly Sampled Signals, L. Nita and J. Oksman, Jun. 1997, IEEE.*
Uniform Sampling of Periodic Signals Using Successive Conversions, Petar Bosnjakovic et al., Feb. 1998, IEEE.*

* cited by examiner

Primary Examiner—Hal Wachsman
Assistant Examiner—Khoi Hung Duong
(74) Attorney, Agent, or Firm—Oliff & Berridge, PLC

(57) ABSTRACT

The invention provides a method of sampling precision measurement signals to achieve an accurate measurement position at a particular measurement time, such that the measurement accuracy is unaffected by the velocity of motion. The method involves sampling each signal during a predetermined sampling period such that a signal from one sensor is sampled first, a signal from a second sensor sampled second, etc., and then the signals are sampled in reverse order such that the first signal sampled is sampled last. These sampled signals are averaged and produce a precision measurement at a time measured at one-half of the sampling time. In addition, this method can be applied to the use of separate scale tracks where each scale track is alternately sampled, or alternatively, where one scale track is sampled in the middle of the sampling period of another scale track.

43 Claims, 9 Drawing Sheets

SYMMETRIC SAMPLING

BACKGROUND OF THE INVENTION

1. Field of Invention

This invention relates to sampling electronic signals. More particularly, this invention is directed to sampling electronic positioning signals generated by induced current linear and rotary position transducers.

2. Description of Related Art

Various movement or position transducing systems are currently available. U.S. patent application Ser. No. 08/788,469, filed Jan. 29, 1997, and incorporated herein by reference in its entirety, discloses an absolute position transducer for high accuracy applications, such as linear or rotary encoders, electronic calipers and the like. The absolute position transducer uses two members movable relative to each other. The first member contains at least one active transmitter for generating a magnetic field and at least one receiver for receiving the generated magnetic field. The passive second member includes passive flux modulating elements that modulate the received field depending on their position relative to the at least one receiver. An electronic circuit coupled to the at least one transmitter and the at least one receiver compares the outputs of the at least one receiver, evaluates the absolute position between the two members, and exhibits the position on a display. The inductive absolute position transducer determines the absolute position between the two members.

Furthermore, U.S. patent application Ser. No. 08/834,432, filed Apr. 16, 1997 and incorporated herein by reference in its entirety, discloses an induced current position transducer with winding configurations that increase the proportion of the useful output signal component relative to the extraneous ("offset") components of the output signal. This is accomplished by winding configurations that minimize and nullify the extraneous coupling between the transmitter and receiver windings.

However, the precision measurement systems using the above transducers must generate and capture two or more positioning signals to absolutely determine any given position. Since the two members, for which the position signals are generated, continue to change position before and after the measurement time, the two or more positioning signals must be sampled at exactly the same time in order to obtain the most precise position, i.e., without incurring a positional error that increases as the velocity of motion increases.

However, a single signal capture circuit cannot record and process two or more processing signals at the exact same time in order to generate the extremely precise position measurements. Therefore, to have two or more position signals sampled at the same time, a precision measurement system would require a separate signal capture circuit to capture each positioning signal. Moreover, using two or more signal capture circuits is impractical for small precision measuring devices due to space, power, and cost requirements.

SUMMARY OF THE INVENTION

The invention provides systems and methods for precisely sampling measurement signals to achieve an accurate measurement position at a particular measurement time. This reduces position errors that are proportional to velocity.

The systems and methods comprise sampling each signal during a predetermined sampling period such that a first signal from one subset of transmitter and receiver windings is sampled at a first time, a second signal from a second subset of transmitter and receiver windings is sampled at a second time, and so on, and then the signals are sampled in reverse order such that the first signal to be sampled is also the last signal to be sampled. These sampled signals are averaged and produce a precision measurement at a time measured at one-half of the sampling interval between the first and last sampling events.

In addition, the systems and methods of this invention can be applied to using separate scale tracks, where each scale track is alternately sampled, or alternatively, where one scale track is sampled in the middle of the sampling period of another scale track.

BRIEF DESCRIPTION OF THE DRAWINGS

The preferred embodiments of this invention will be described in detail, with reference to the following figures, wherein.

DETAILED DESCRIPTION OF PREFERRED EMBODIMENTS

Figure 1:
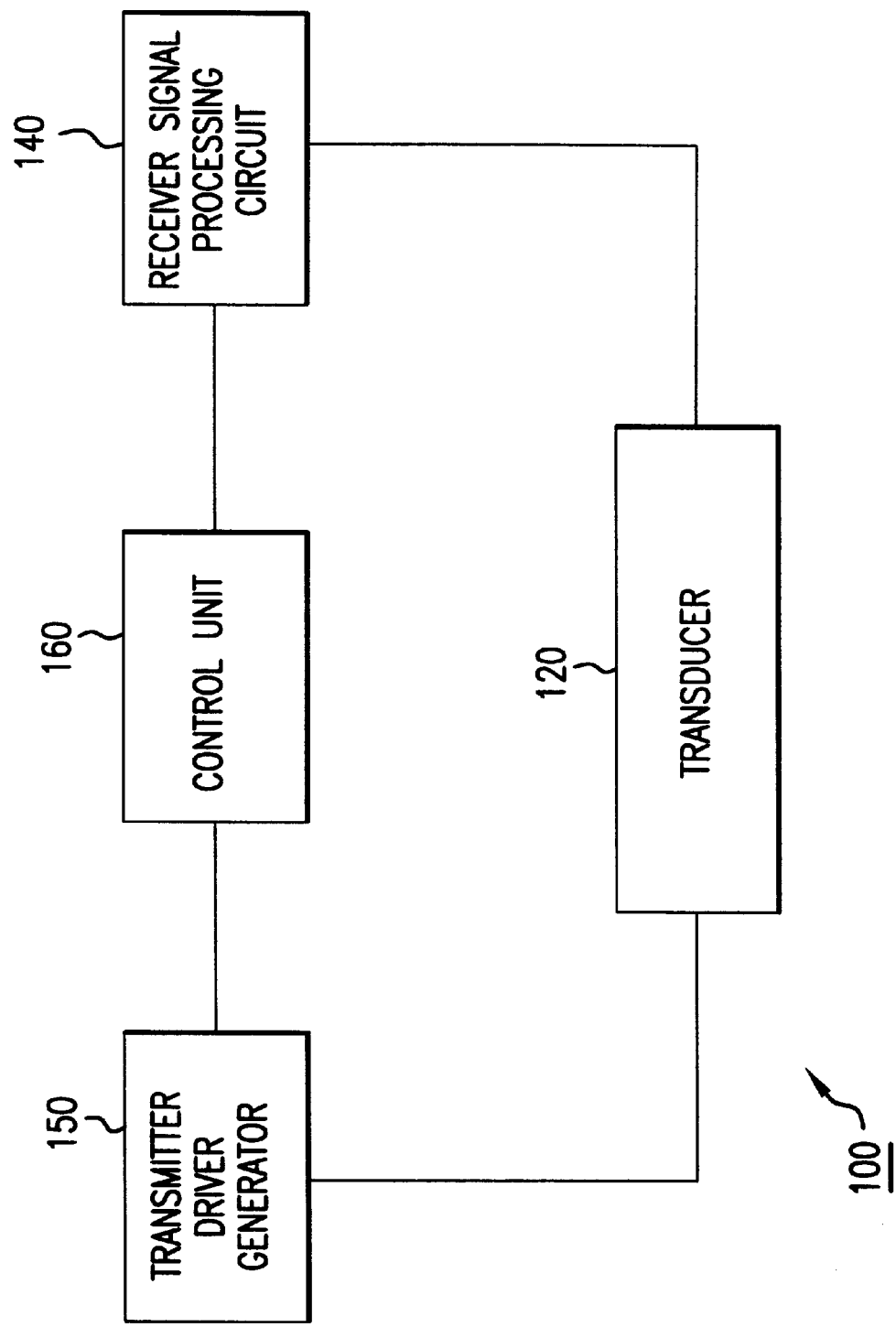
FIG. 1 is a functional block diagram of an induced current position transducer.

FIG. 1 shows a functional block diagram of an induced current position transducer system 100. The induced current position transducer system 100 includes a transducer 120 connected to a transmitter driver generator 150 and a receiver signal processing circuit 140. The transmitter driver generator 150 and the receiver signal processing circuit 140 are also connected to a control unit 160.

While FIG. 1 shows a functional block diagram for the induced current position transducer system 100, it should be appreciated that the induced current position transducer system 100 is presented as an exemplary embodiment. The symmetric sampling systems and methods of this invention may be implemented on a variety of transducers systems or other appropriate known or later developed precision measuring systems, for example.

Furthermore, it should also be appreciated that the transducer 120 may be implemented using any appropriate known or later developed multiphase transducer, including, for example, the transducers disclosed in the incorporated 469 and 432 applications.

The transducer 120 includes a read head that is movable relative to a scale member. The scale member and the read head are preferably formed on a printed circuit board using standard printed circuit board technology, but can be formed using any appropriate known or later developed process. The read head of the transducer 120 includes one or more transmitter windings and one or more receiver windings. The one or more transmitter windings are connected to the drive signal generator 150. The drive signal generator 150 provides a time-varying drive signal and is connectable to each transmitter winding. The time-varying drive signal is preferably a high frequency sinusoidal signal, a pulse signal or an exponentially decaying sinusoidal signal. When the time-varying drive signal is applied to a transmitter winding, the time-varying current flowing in that transmitter winding generates a corresponding time-varying, or changing, magnetic field.

The receiver signal processing circuit 140 inputs and samples output signals from one or more of the one or more receiver winding of the transducer 120, and converts each received signal to a digital output signal. The digital output signals are then output to the control unit 160. The control unit 160 processes these digital output signals to determine the position of the read head relative to the scale member to within a fraction of a shortest wavelength of the transducer.

The control unit 160 also outputs control signals to the transmitter drive signal generator 150 to generate the time-varying transmitter drive signal. It should be appreciated that any of the signal generating or signal processing circuits shown in the incorporated 469 and 432 applications, or any other known or later developed signal generating or signal processing circuits, can be used to implement the signal processing circuit 140, the transmitter drive signal 150, and/or the control unit 160. Thus, these circuits will not be described in further detail herein.

Figure 2:
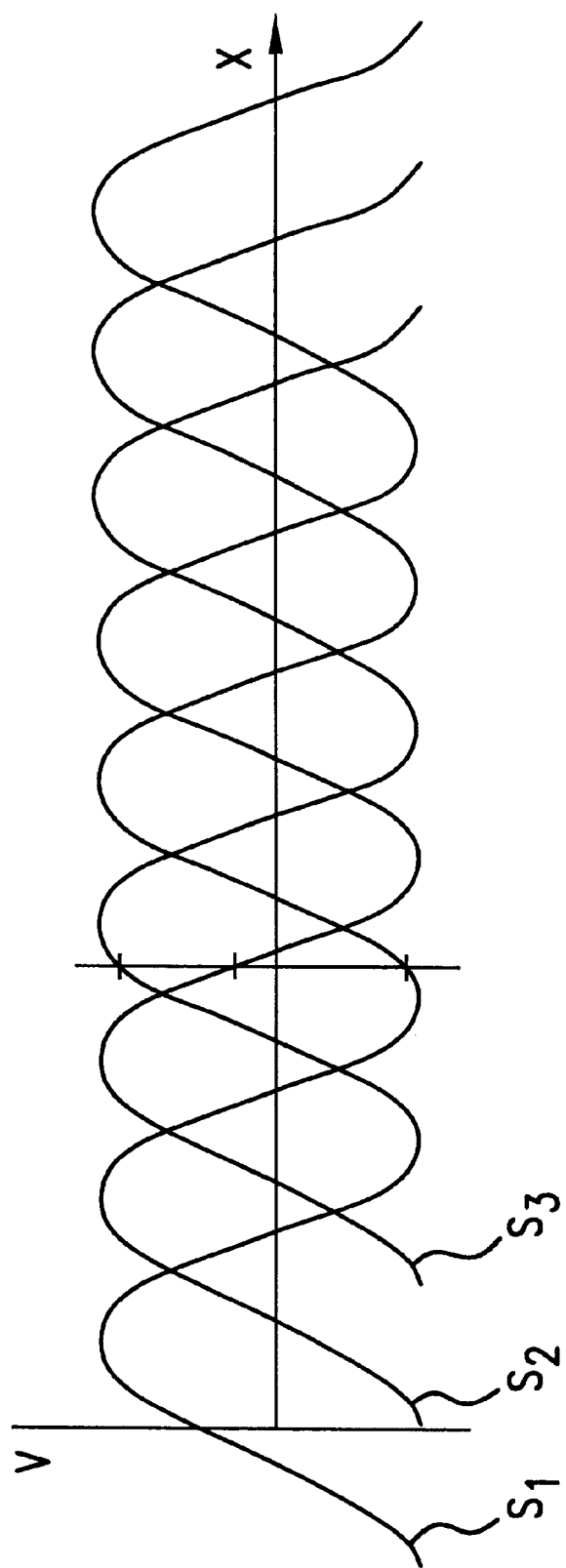
FIG. 2 shows the signal amplitudes as a function of the relative position of the scale member and read head.

FIG. 2 shows the signal functions from the three receiver windings of a three-phase transducer as a function of the position along the measurement axis. It should be appreciated that perfectly sinusoidally output functions are difficult to achieve in practice, and that deviations from a perfect sinusoidally output contain spatial harmonics of the fundamental wavelength of the transducer. Therefore, the three-phase configuration of this embodiment of the induced current position transducer has a significant advantage over other transducers, in that the third harmonic content in the separate signals can be largely eliminated as a source of position measurement error.

It should be further appreciated that the symmetric sampling process of the invention can be performed for sampling any number of signals greater than one. However, for ease of discussion, the following discussion of the exemplary embodiments of the systems and methods of this invention focuses primarily on three-phase transducers.

Figure 3:
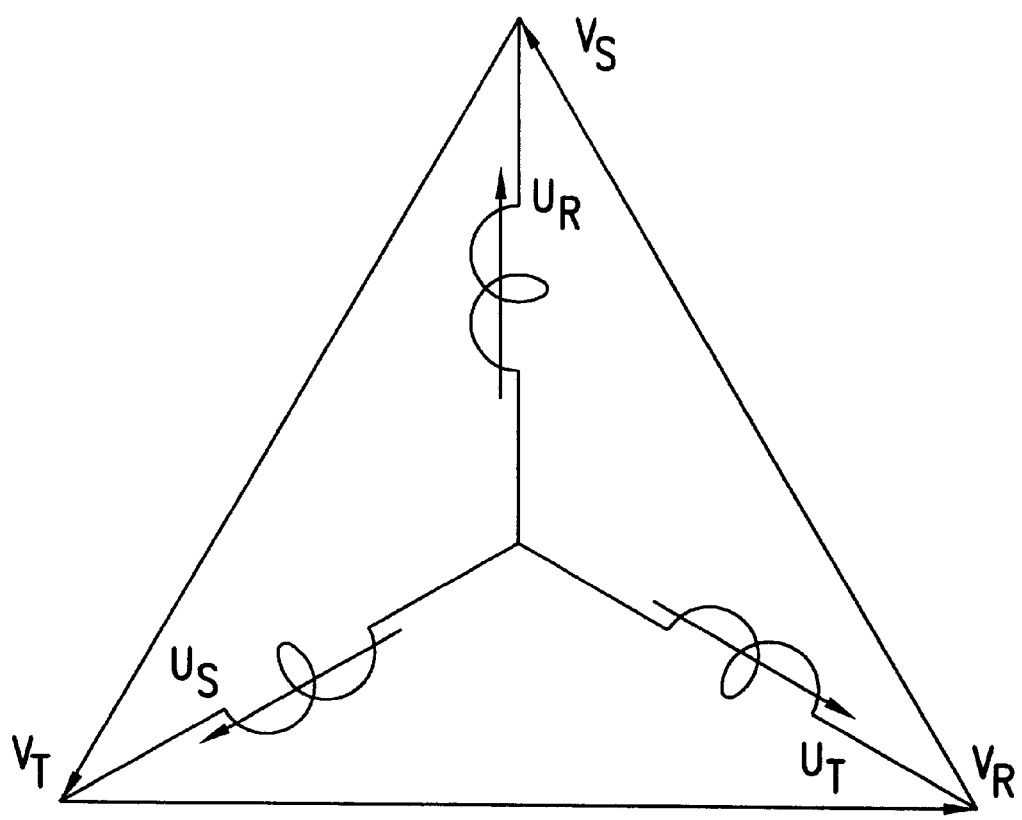
FIG. 3 shows a schematic vector phase diagram for a three-phase winding transducer.

Eliminating the third harmonic is accomplished by combining the three outputs of the one or more receivers winding, as shown in the vector diagram of FIG. 3, where the three signal outputs are connected in a star configuration and the signals used for determining position are taken between the corners of the star. This could also be accomplished by measuring each of the output signals independently from the one or more receiver windings and then combining the three output signals in a corresponding way in a digital signal processing circuit. A description of how the third harmonic component is eliminated by combining the original three-phase signals is described in the incorporated 432 application, and thus will not be discussed below.

Figure 4:
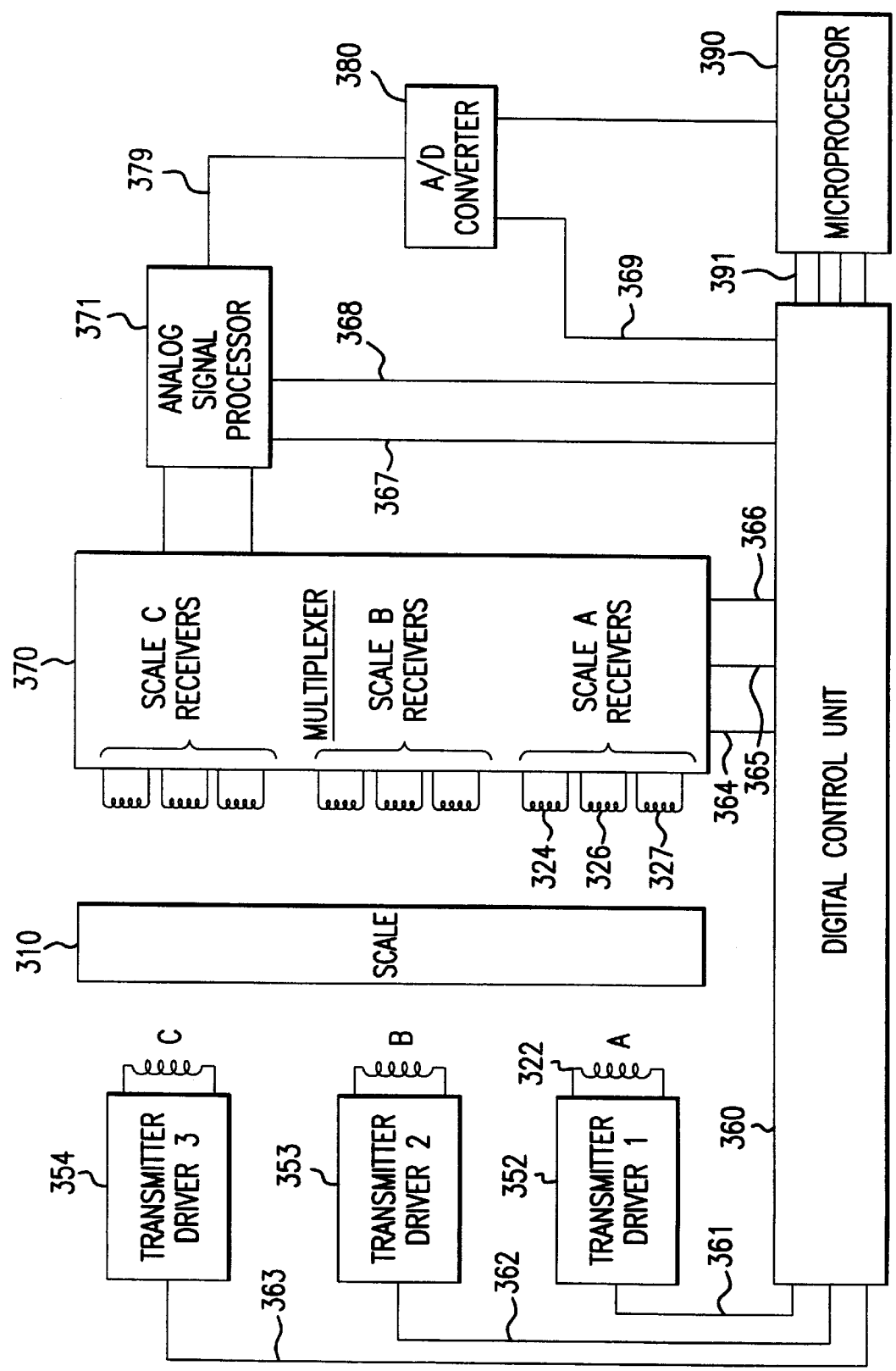
FIG. 4 is a block diagram of a read head and an associated signal processing circuit.

FIG. 4 shows a block diagram of one exemplary embodiment of an induced current position transducer using a three-phase read head according to this invention. As shown in FIG. 4, a transmitter winding 322 is connected to a transmitter driver circuit 352.

The transmitter winding 322 is indirectly inductively coupled via coupling loops formed on a scale member of the induced current position transducer to the first-third receiver windings 324, 326 and 327, which are connected to a multiplexer 370. The output of the multiplexer 370 is connected to an analog processor 371. The output of the analog signal processor 371 is connected to a single output line 379 that is connected to an input of an analog-to-digital (A/D) converter 380. The A/D converter 380 converts the output of the analog signal processor 371 from an analog signal to a digital signal. The digital signal from the A/D converter 380 is output to a microprocessor 390, which processes the digital signal from the A/D converter 380 to determine the relative position between the read head and the scale member 310.

Each position within a wavelength can be uniquely identified by the microprocessor 390 according to known techniques and equations disclosed in the incorporated 469 and 432 applications.

The microprocessor 390 also controls the sequence of signal sampling by outputting a control signal over a signal lines 391 to a digital control unit 360. The digital control unit 360 controls the sequence of transmission, signal sampling and A/D conversion by outputting control signals on the signal lines 361–369 to the transmitter driver 352, multiplexer 370, and the analog processor 371.

In particular, as shown in FIG. 4, the digital control unit 360 outputs control signals over the signal lines 361–363 to the transmitter drivers 352–354, respectively, to controllably excite the transmitter windings. The digital control unit 360 outputs switch and control signals on the signal lines 364–366 to the multiplexer 370. The control signals 364–366 determine which of the possible phases of the multi scale-track, multi-phase receiver windings 324, 326 and 327 is input to the analog signal processing circuits 371 that follow the multiplexer 370.

FIG. 4 shows an example of a three scale track design, where there are three sets of three phase receiver windings. The multiplexer 370 will choose one signal, or in the case of differential measurements, one signal pair, to be output to the analog signal processor 371. The chosen signal, or signal pair, is then processed by the analog signal processor 371. The output of the analog signal processor 371 is signal 379, which is input to A/D converter 380. The microprocessor 390 can access the output of the A/D converter 380. Furthermore, because the microprocessor 390 controls the operation of the digital control unit 360, the microprocessor 390 can choose to select the scale tracks or phases in any sequential order. The particular choice of this order is an important aspect of this invention.

It should also be appreciated that the above embodiment that describes signal multiplexing between the multiple phases of a single set of receivers will also apply equally well to the multiplexing between the multiple phases of 2 or more sets of multi phase receivers. For example, in a 3-scale-track system as shown in FIG. 4, the input multiplexer 370 can choose between 9 possible phase pairs to process. To cancel certain circuit errors, it can also choose these phase pairs in a reverse polarity mode that effectively inverts the signal. Thus there are in total 18 possible ways to process the nine phase pairs of a three-scale-track, three phase system.

Figure 5:
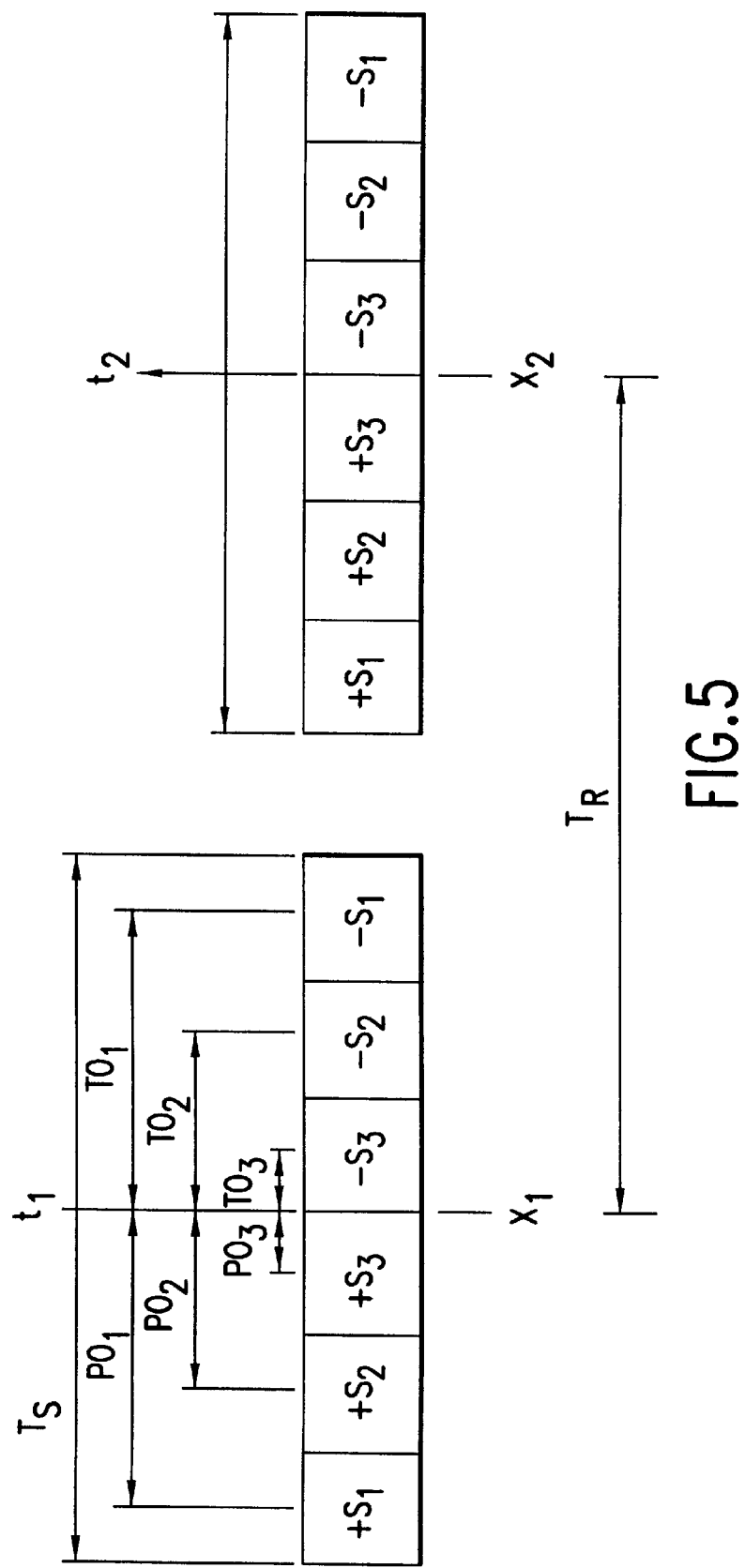
FIG. 5 illustrates a first exemplary embodiment of the sampling sequence for a single scale track according to the systems and methods according to this invention.

FIG. 5 is a diagram schematically illustrating one exemplary symmetric sampling sequence of the symmetric sampling systems and methods according to this invention. Ideally, phase signals S1, S2 and S3 of one scale track would be sampled simultaneously for every given sampling time t. However, this simultaneous sampling process would require additional hardware that adds expense, size, and complexity.

Therefore, according to the symmetric sampling systems and methods according to this invention, the three signals are sampled over time $T_s$ such that a signal +S1 is sampled during a first sampling interval at an effective sample time that precedes time $t_1$ by a preceding offset period $PO_1$. Similarly, a signal +S2 is sampled during a second sampling interval, a signal +S3 is sampled during a third sampling interval, the signal −S3 is sampled during the fourth sampling interval, the signal −S2 is sampled during a fifth sampling interval and the signal −S1 is sampled during a sixth sampling interval. Ideally, $PO_n$ equals $TO_n$ for these six signals. When all six signals have been acquired by the microprocessor 390, they are combined into synthetic samples $S'_n$ in the following manner:

$$S'_1 = (+S_1) - (-S_1)$$

$$S'_2 = (+S_2) - (-S_2)$$

$$S'_3 = (+S_3) - (-S_3)$$

This method of combining the six signals into three, results in an averaging effect. If the transducer is in a state of high velocity motion during the sampling period, the averaging of the signals, as shown above, produces results similar to what would have been obtained if the six measurements would have been acquired simultaneously at the time $t_1$. The time $t_1$ is taken as the effective synthetic sampling time for the corresponding position measurement $x_1$ from the scale. When the three signals $S'_1$, $S'_2$, and $S'_3$ are processed in microprocessor 390, the position $x_1$ can be determined from these signals with a high degree of accuracy, independent of the velocity of motion.

Figure 6:
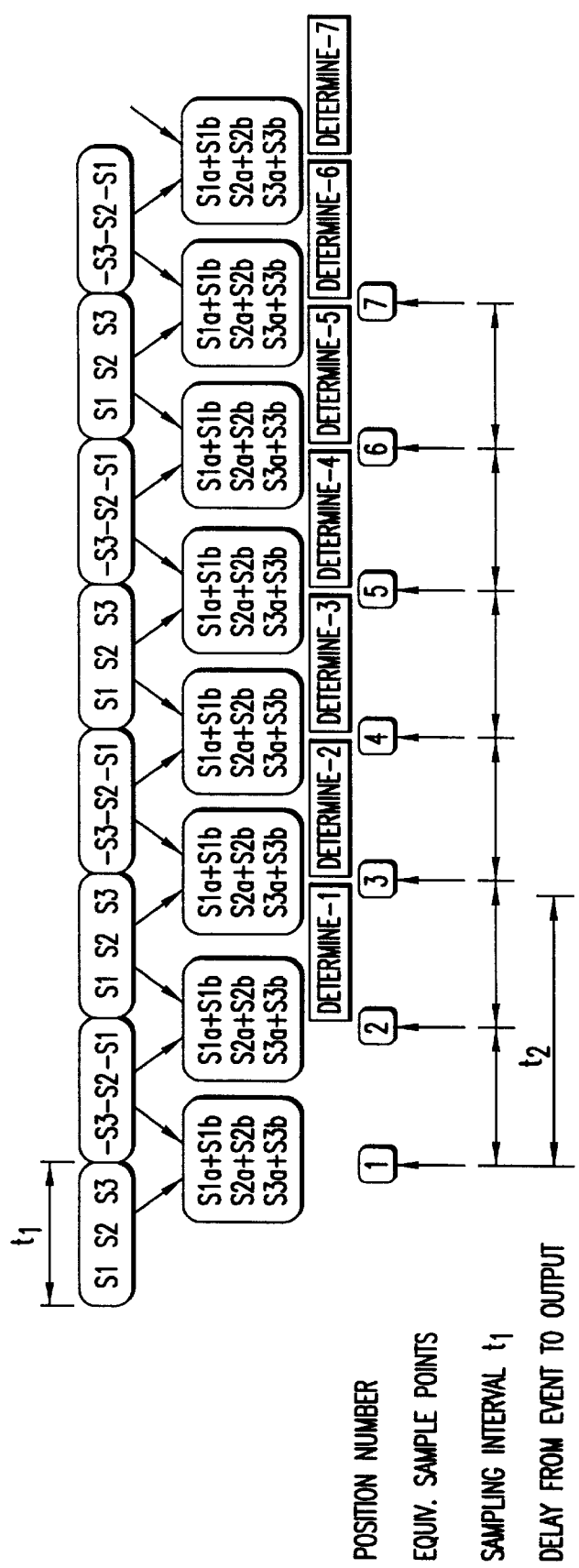
FIG. 6 illustrates a second exemplary embodiment of the sampling sequence for a single scale track according to the systems and methods according this invention.

FIG. 6 illustrates the sampling sequence in FIG. 5 but re-uses some sample data to allow twice the position determination rate. For example, a first set of the signals S1 to −S3 are sampled over a first sample interval $t_1$. A second set of the signals −S3 to −S1 are then sampled over a second sample interval $t_1$. The relative position is determined based on the first and second sets of signals S1–S3 as outlined above. The relative position is determined relative to a synthetic sample time position 1, which occurs between the first and second time intervals $t_2$ and $t_2$.

Then, a third set of the signals S1–S3 are sampled over a third time interval $t_3$. In this case, the third set of signals are sampled in the same order as the first set of signals. However, the signals S1 now occupies the third and fourth sampling intervals, and the signal S3 now occupies the first and sixth sampling intervals. The next relative position is determined based on the second and third sets of signals S3–S1. The relative position is determined relative to a time position 2, which occurs between the second and third time intervals $t_2$ and $t_3$.

Figure 7:
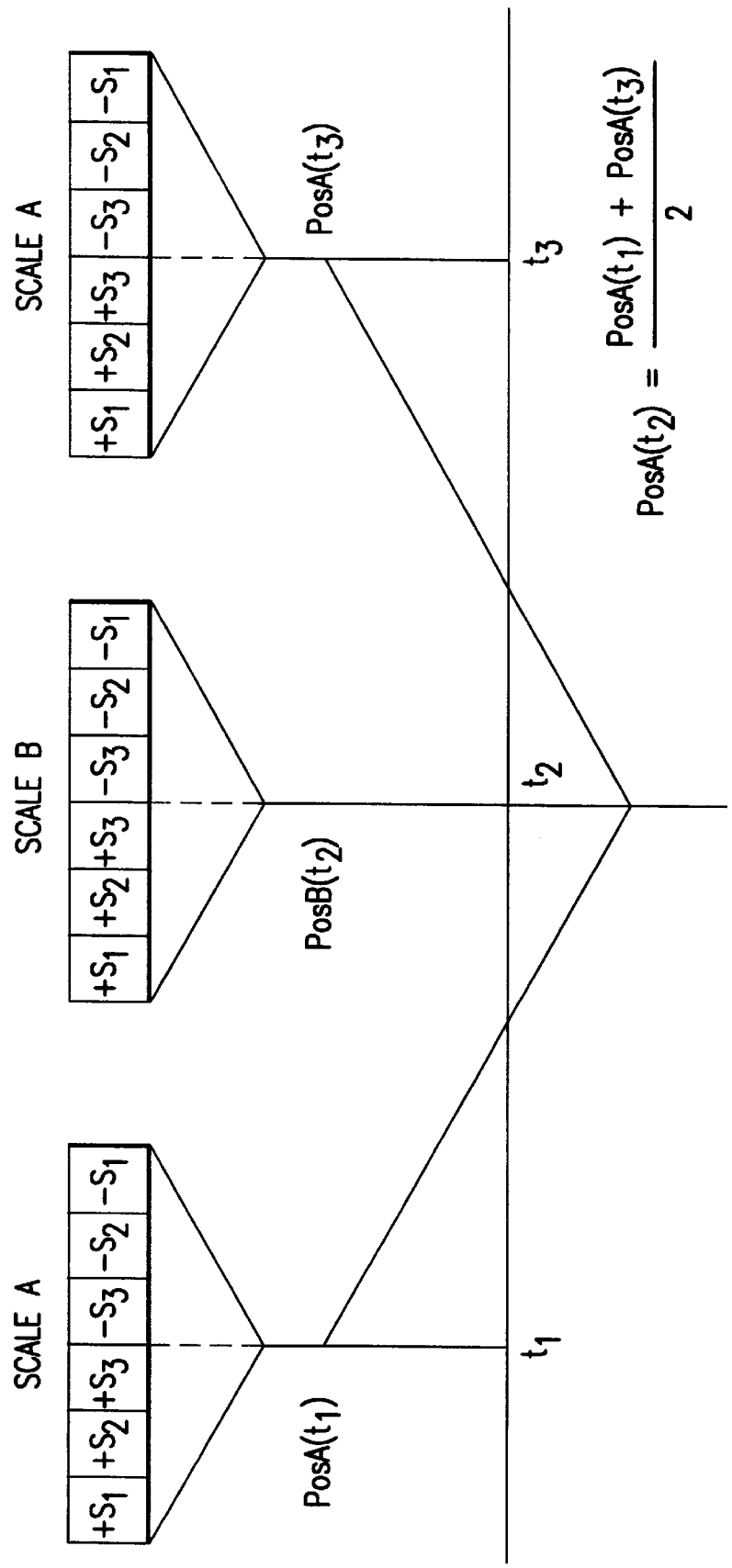
FIG. 7 illustrates a first exemplary embodiment of the sampling of channels for a two scale track measurement of the systems and methods according to this invention.
Figure 8:
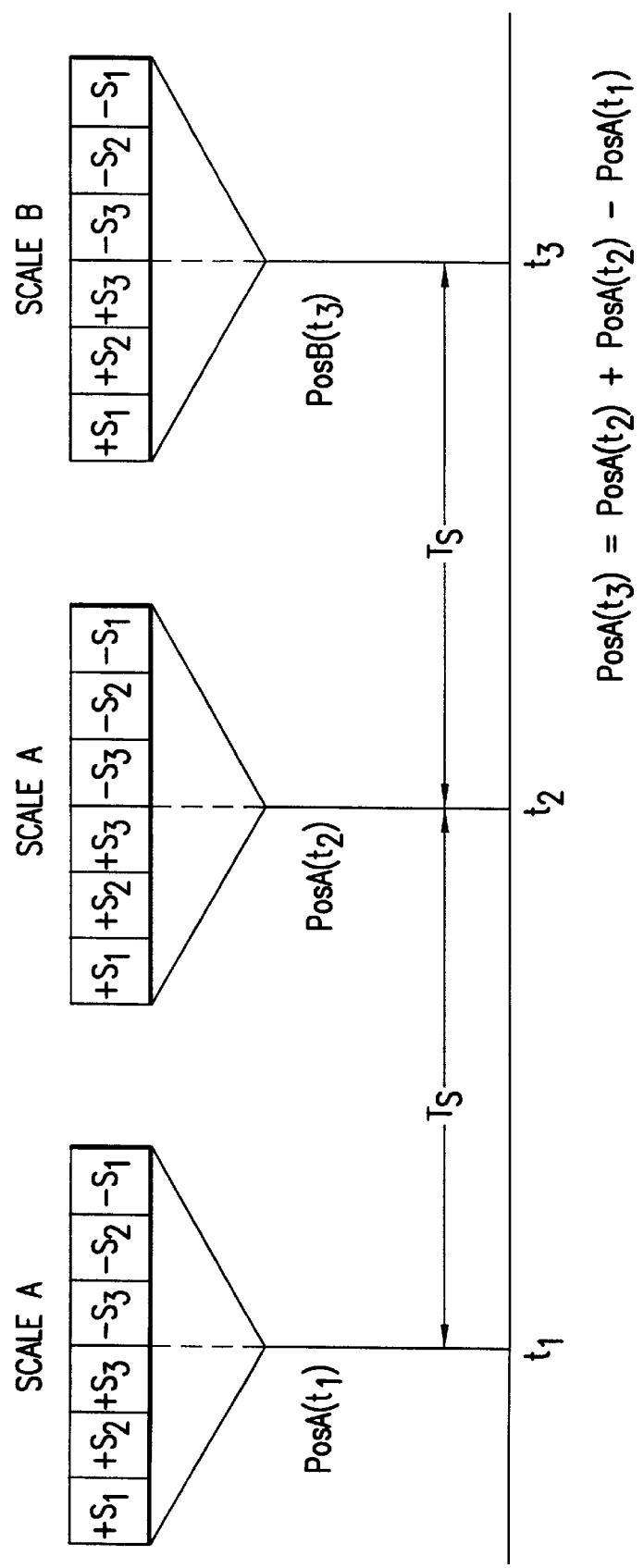
FIG. 8 illustrates a second exemplary embodiment of the sampling of channels for a two scale track measurement of the systems and methods according to this invention.

FIGS. 7 and 8 show two different sampling sequences for sampling a second scale track at selected intervals. The second scale track could be used with the first scale track to form a synthetic coarse wavelength. Information from both scale tracks is then combined to determine an absolute position. Using a second (or third) scale track introduces a further difficulty in obtaining accurate measurements when the transducer is moving with a substantial velocity. The difficulty is caused by the inability of the system to measure both scale tracks simultaneously. The symmetric sampling invention can be then extended to solve this problem by choosing the appropriate sequence of samples that ensures an approximation to simultaneous sampling of two scale tracks.

As shown in FIG. 7, the scale track B measurements are inserted in the sequence of scale track A measurements. The scale track A position value at the time of scale track B measurement must then be determined. Two alternatives methods may be used.

In a first alternative method, as shown in FIG. 7, the position value from scale track A, $POSA(t_1)$, is measured corresponding to sample time $t_1$ and the position value from scale track A, $POSA(t_3)$ is measured corresponding to sample time $t_3$. The position value from scale track B, $POSA(t_2)$, is measured corresponding to sample time $t_2$. If the two scale track A values, $POSA(t_1)$ and $POSA(t_3)$ are averaged, then the intermediate value $POSA(t_2)$, call be fabricated. This will be matched in time with the position measurement from scale track B, $POSB(t_2)$. Symmetric sampling of two scale tracks therefore allows an accurate coarse measurement to be made even if the transducer is moving with a high velocity.

In a second alternative method, as shown in FIG. 8, any time a scale track B measurement is performed, it can be matched with a calculated scale track A position by using the two previous scale track A values. $POSA(t_3)$ can be determined from $POSA(t_1)$ and $POSA(t_2)$ by:

$$POSA(t_3) = POSA(t_2) + (POSA(t_2) - POSA(t_1)).$$

This second alternative method is accurate provided the velocity does not change during the measurement time.

Figure 9:
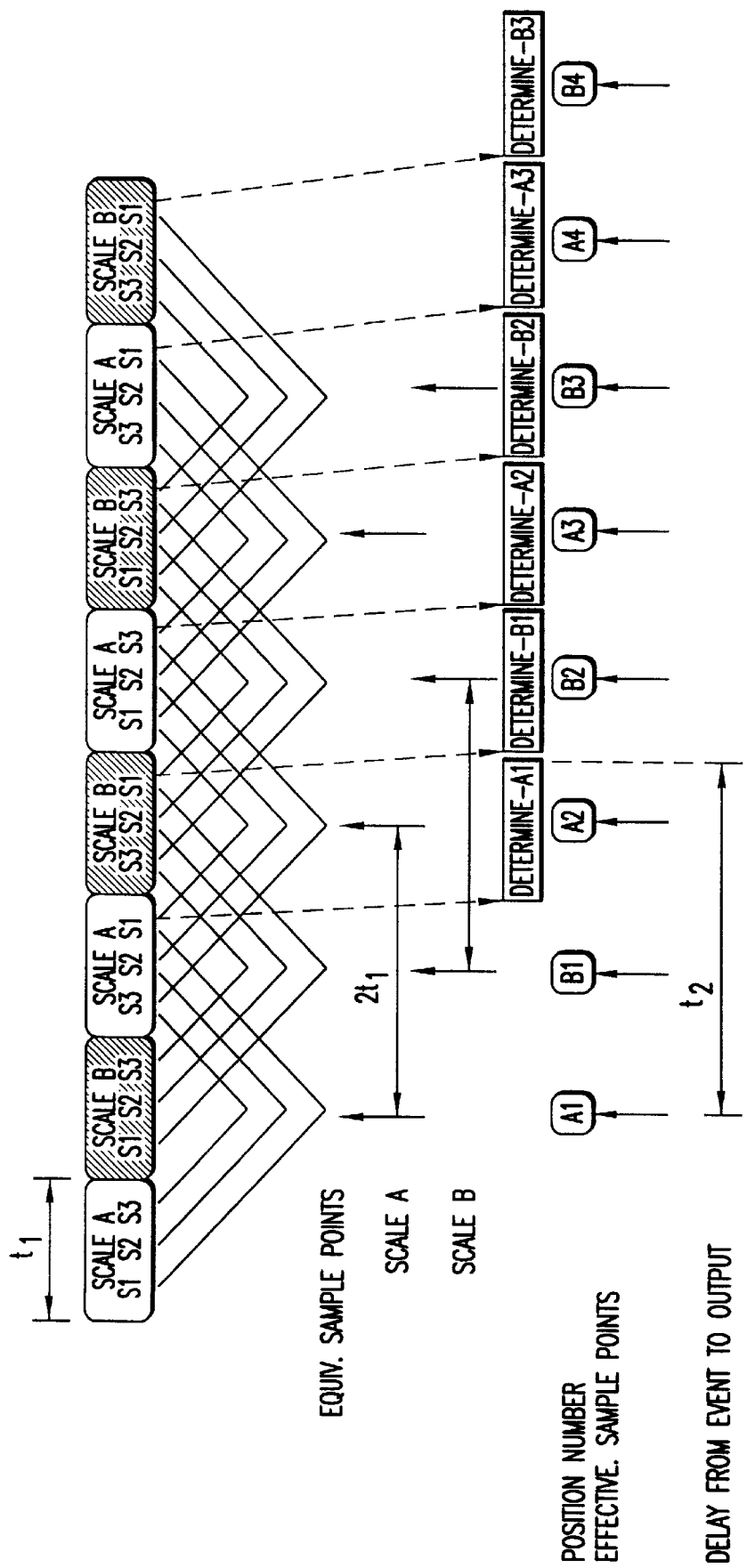
FIG. 9 illustrates a third exemplary embodiment of sampling of channels for concurrent two scale track measurement of the systems and methods according to this invention.

FIG. 9 illustrates alternate sampling of scale track A and scale track B for concurrent coarse measurement. Alternate sampling is the recommended method for initial coarse measurement at the start-up of the measuring system.

In the alternate sampling method, three signals for scale track A are sampled as in FIG. 5, over time $t_1$ such that a signal S1 is sampled during a first sampling interval, a signal S2 is sampled during a second sampling interval, and a signal S3 is sampled during a third sampling interval. Then, three signals from scale track B are sampled over time $t_1$ in the same manner such that a signal S1 for scale track B is sampled during a fourth sampling interval, a signal S2 is sampled during a fifth sampling interval, and a signal S3 is sampled during a sixth sampling interval.

This symmetric sampling method then shifts back to sampling scale track A where a signal −S3 is sampled during a seventh sampling interval, the signal −S2 is sampled during an eighth sampling interval, and the signal −S1 is sampled during a ninth sampling interval. Then for scale track B, the signal −S3 is sampled during the tenth sampling interval, the signal −S2 is sampled during an eleventh sampling interval, and the signal −S1 is sampled during a twelfth sampling interval.

In this manner, the real position $x_n$ for scale track A is determined at time position number A1, and at subsequent time position numbers A2, A3, etc. at time intervals at $2t_1$ apart. The position $x_n$ for scale track B is determined at time position number B1, B2, B3, etc., at an interval of $2t_1$ but delayed by an interval of $t_1$ from the time positions for scale track A.

Thus, by continuously alternating between scale track A and scale track B according to FIG. 9, a sampling interval of $2t_1$ is achieved for both channels. The delay from the equivalent sampling point to data is about $t_1$ plus any computing time. The coarse measurement can be calculated and monitored continuously. The synchronization of scale track A and scale track B phase readings can be done according to the same methods described above.

What is claimed is:

1. A method for sampling at least one signal, comprising:

determining a synthetic sampling time;

sampling each signal over a sample interval that precedes the synthetic sampling time by a corresponding preceding offset period to generate a preceding signal sample of each of the at least one signal;

sampling each signal over a sample interval that trails the synthetic sampling time by a corresponding trailing offset period to generate a trailing signal sample of each of the at least one signal; and combining, for each signal, the preceding and trailing signal samples of that signal into a synthetic sample corresponding to the synthetic sampling time.

2. The method of claim 1, further comprising:

determining at least one additional synthetic sampling time; and repeating the sampling steps and the combining step for each additional synthetic sampling time.

3. The method of claim 1, wherein:

the at least one signal comprises a first signal, a second signal and a third signal;

sampling each signal over a sampling interval that precedes the synthetic sampling time by a corresponding preceding offset period comprises:

sampling the first signal over a first leading sampling interval that precedes the synthetic sampling time by a first preceding offset period, sampling the second signal over a second leading sampling interval that precedes the synthetic sampling time by a second preceding offset period, and sampling the third signal over a third leading sampling interval that precedes the synthetic sampling time by a third preceding offset period; and sampling each signal over a sampling interval that trails the synthetic sampling time by a corresponding trailing offset period comprises:

sampling the first signal over a first lagging sampling interval that trails the synthetic sampling time by a first trailing offset period, sampling the second signal over a second lagging sampling interval that trails the synthetic sampling time by a second trailing offset period, and sampling the third signal over a third lagging sampling interval that trails the synthetic sampling time by a third trailing offset period.

4. The method of claim 3, further comprising:

determining at least one additional synthetic sampling time; and repeating the sampling steps and the combining step for each additional synthetic sampling time.

5. The method of claim 4, wherein:

determining the at least one additional synthetic sampling time comprises determining a next synthetic sampling time based on the previous synthetic sampling time and the first, second and third trailing offset periods such that the first, second and third lagging sampling intervals corresponding to the previous synthetic sample precede the next synthetic sampling period by fourth, fifth and sixth preceding offset periods, respectively; and repeating the sampling steps and the combining step for the next synthetic sampling time comprises:

sampling the first signal over the first lagging sampling interval that trails the next synthetic sampling time by the fourth preceding offset period, sampling the second signal over the second lagging sampling interval that trails the next synthetic sampling time by the fifth preceding offset period, sampling the third signal over the third lagging sampling interval that trails the next synthetic sampling time by the sixth preceding offset period, and combining, for each signal, the trailing signal sample of that signal for the previous synthetic sampling time and the trailing signal sample of that signal for the next synthetic sampling time into a synthetic sample corresponding to the next synthetic sampling time.

6. The method of claim 5, wherein the fourth, fifth and sixth preceding offset periods are equal to the third, second and first preceding offset periods, respectively.

7. The method of claim 1, wherein:

the at least one signal comprises a plurality of signals; and the corresponding preceding and trailing offset periods for each of the plurality of signals are different from the corresponding preceding and trailing offset periods for each other signal.

8. The method of claim 7, further comprising:

determining at least one additional synthetic sampling time; and repeating the sampling steps and the combining step for each additional synthetic sampling time.

9. The method of claim 7, wherein:

determining the at least one additional synthetic sampling time comprises determining a next synthetic sampling time based on the previous synthetic sampling time and the corresponding different preceding and trailing offset periods of the plurality of signals such that the lagging sampling interval for each of the plurality of signals corresponding to the previous synthetic sample precedes the next synthetic sampling period by a second corresponding preceding offset period; and repeating the sampling steps and the combining step for the next synthetic sampling time comprises:

sampling each signal over a lagging sample interval that trails the next synthetic sampling time by a second corresponding trailing offset period to generate a trailing signal sample of each of the plurality of signals; and combining, for each signal, the trailing signal sample of that signal for the previous synthetic sampling time and the trailing signal sample of that signal for the next synthetic sampling time into a synthetic sample corresponding to the next synthetic sampling time.

10. The method of claim 9, wherein, for each of the plurality of signals, the second corresponding preceding and trailing offset periods are equal to the corresponding preceding and trailing offset periods.

11. The method of claim 1, wherein the at least one signal is a first set of at least one signal, the method further comprising:

determining a second synthetic sampling time;

sampling each signal of a second set of at least one signal different than the first set of at least one signal over a sample interval that precedes the second synthetic sampling time by a second corresponding preceding offset period to generate a preceding signal sample of each signal of the second set of at least one signal;

sampling each signal of the second set of at least one signal over a sample interval that trails the second synthetic sampling time by a second corresponding trailing offset period to generate a trailing signal sample of each signal of the second set of at least one signal; and combining, for each signal of the second set of at least one signal, the preceding and trailing signal samples of that signal into a synthetic sample of each signal of the second set of at least one signal corresponding to the second synthetic sampling time.

12. The method of claim 11, wherein the second synthetic sampling time trails the first synthetic sampling time by a sample offset period, the method further comprising:

determining a third synthetic sampling time that trails the second synthetic sampling time by the sample offset period; and repeating the sampling steps and the combining step for the first set of at least one signal for the third synthetic sampling time.

13. The method of claim 11, wherein the second synthetic sampling time trails the first synthetic sampling time by a sample offset period, the method further comprising:

determining a third synthetic sampling time that trails the first synthetic sampling time by one half of the sample offset period; and repeating the sampling steps and the combining step for the first set of at least one signal for the third synthetic sampling time.

14. The method of claim 11, wherein:

sampling each signal of the second set of at least one signal over the sample interval that precedes the second synthetic sampling time occurs after sampling each signal of the first set of at least one signal over the sample interval that precedes the first synthetic sampling time and before sampling each signal of the first set of at least one signal over the sample interval that trails the first synthetic sampling time; and sampling each signal of the second set of at least one signal over the sample interval that trails the second synthetic sampling time occurs after sampling each signal of the first set of at least one signal over the sample interval that trails the first synthetic sampling time.

15. A method for determining a position of a read head relative to a scale member, the read head and scale having a first set of transducer elements formed thereon, the first set of transducer elements generating a first set of at least one signal based on the relative position of the read head and the scale member, the method comprising:

determining a synthetic sampling time;

sampling each signal of a first set of the at least one signal over a sample interval that precedes the synthetic sampling time by a corresponding preceding offset period to generate a preceding signal sample of each signal of the first set;

sampling each signal of the first set over a sample interval that trails the synthetic sampling time by a corresponding trailing offset period to generate a trailing signal sample of each signal of the first set;

combining, for each signal of the first set, the preceding and trailing signal samples of that signal into a synthetic sample corresponding to the synthetic sampling time; and determining the position of the read head relative to the scale member at the synthetic sampling time based on the at least one synthetic sample of the first set.

16. The method of claim 15, further comprising:

determining at least one additional synthetic sampling time; and repeating the sampling steps and the combining and determining steps for each additional synthetic sampling time.

17. The method of claim 15, wherein:

the first set of at least one signal comprises a first signal, a second signal and a third signal;

sampling each signal over a sampling interval that precedes the synthetic sampling time by a corresponding preceding offset period comprises:

sampling the first signal over a first leading sampling interval that precedes the synthetic sampling time by a first preceding offset period, sampling the second signal over a second leading sampling interval that precedes the synthetic sampling time by a second preceding offset period, and sampling the third signal over a third leading sampling interval that precedes the synthetic sampling time by a third preceding offset period; and sampling each signal over a sampling interval that trails the synthetic sampling time by a corresponding trailing offset period comprises:

sampling the first signal over a first lagging sampling interval that trails the synthetic sampling time by a first trailing offset period, sampling the second signal over a second lagging sampling interval that trails the synthetic sampling time by a second trailing offset period, and sampling the third signal over a third lagging sampling interval that trails the synthetic sampling time by a third trailing offset period.

18. The method of claim 17, further comprising:

determining at least one additional synthetic sampling time; and repeating the sampling steps and the combining and determining steps for each additional synthetic sampling time.

19. The method of claim 18, wherein:

determining the at least one additional synthetic sampling time comprises determining a next synthetic sampling time based on the previous synthetic sampling time and the first, second and third trailing offset periods such that the first, second and third lagging sampling intervals corresponding to the previous synthetic sample precede the next synthetic sampling period by fourth, fifth and sixth preceding offset periods, respectively; and repeating the sampling steps and the combining and determining steps for the next synthetic sampling time comprises:

sampling the first signal over the first lagging sampling interval that trails the next synthetic sampling time by the fourth preceding offset period, sampling the second signal over the second lagging sampling interval that trails the next synthetic sampling time by the fifth preceding offset period, sampling the third signal over the third lagging sampling interval that trails the next synthetic sampling time by the sixth preceding offset period, combining, for each signal, the trailing signal sample of that signal for the previous synthetic sampling time and the trailing signal sample of that signal for the next synthetic sampling time into a next synthetic sample corresponding to the next synthetic sampling time; and determining the position of the read head relative to the scale member for the first set of transducer elements at the next synthetic sampling time based on the at least one next synthetic sample of the first set.

20. The method of claim 19, wherein the fourth, fifth and sixth preceding offset periods are equal to the third, second and first preceding offset periods, respectively.

21. The method of claim 15, wherein:
the first set of at least one signal comprises a plurality of signals; and
the corresponding preceding and trailing offset periods for each of the plurality of signals of the first set are different from the corresponding preceding and trailing offset periods for each other signal of the first set.

22. The method of claim 21, further comprising:
determining at least one additional synthetic sampling time; and
repeating the sampling steps and the combining and determining steps for each additional synthetic sampling time.

23. The method of claim 21, wherein:
determining the at least one additional synthetic sampling time comprises determining a next synthetic sampling time based on the previous synthetic sampling time and the corresponding different preceding and trailing offset periods of the plurality of signals of the first set such that the lagging sampling interval for each of the plurality of signals of the first set corresponding to the previous synthetic sample precedes the next synthetic sampling period by a second corresponding preceding offset period; and
repeating the sampling steps and the combining and determining steps for the next synthetic sampling time comprises:
sampling each signal of the plurality of signals of the first set over a lagging sample interval that trails the next synthetic sampling time by a second corresponding trailing offset period to generate a trailing signal sample of each of the plurality of signals of the first set;
combining, for each signal of the plurality of signals of the first set, the trailing signal sample of that signal for the previous synthetic sampling time and the trailing signal sample of that signal for the next synthetic sampling time into a next synthetic sample corresponding to the next synthetic sampling time; and
determining the position of the read head relative to the scale member for the first set of transducer elements at the next synthetic sampling time based on the at least one next synthetic sample of the first set.

24. The method of claim 23, wherein, for each of the plurality of signals, the second corresponding preceding and trailing offset periods are equal to the corresponding preceding and trailing offset periods.

25. The method of claim 15, wherein the read head and scale further have at least a second sets of transducer elements formed thereon, the second set of transducer elements generating a second set of at least one signal based on the relative position of the read head and the scale member, the method further comprising:
determining a second synthetic sampling time;
sampling each signal of the second set over a sample interval that precedes the second synthetic sampling time by a second corresponding preceding offset period to generate a preceding signal sample of each signal of the second set of at least on signal;
sampling each signal of the second set of at least one signal over a sample interval that trails the second synthetic sampling time by a second corresponding trailing offset period to generate a trailing signal sample of each signal of the second set of at least one signal;
combining, for each signal of the second set of at least one signal, the preceding and trailing signal samples of that signal into a second synthetic sample of each signal of the second set of at least one signal corresponding to the second synthetic sampling time; and
determining the position of the read head relative to the scale member for the second set of transducer elements at the second synthetic sampling time based on the at least one second synthetic sample of the second set.

26. The method of claim 25, wherein the second synthetic sampling time trails the first synthetic sampling time by a sample offset period, the method further comprising:
determining a third synthetic sampling time that trails the second synthetic sampling time by the sample offset period; and
repeating the sampling steps and the combining and determining steps for the first set of at least one signal for the third synthetic sampling time.

27. The method of claim 26, further comprising determining the position of the read head relative to the scale member for the first set of transducer elements at the second synthetic sampling time based on the determined positions of the read head relative to the scale member for the first set of transducer elements at the first and third synthetic sampling times.

28. The method of claim 25, wherein the second synthetic sampling time trails the first synthetic sampling time by a sample offset period, the method further comprising:
determining a third synthetic sampling time that trails the first synthetic sampling time by one half of the sample offset period; and
repeating the sampling steps and the combining and determining steps for the first set of at least one signal for the third synthetic sampling time.

29. The method of claim 28, further comprising determining the position of the read head relative to the scale member for the first set of transducer elements at the second synthetic sampling time based on the determined positions of the read head relative to the scale member for the first set of transducer elements at the first and third synthetic sampling times.

30. The method of claim 25, wherein:
sampling each signal of the second set of at least one signal over the sample interval that precedes the second synthetic sampling time occurs after sampling each signal of the first set of at least one signal over the sample interval that precedes the first synthetic sampling time and before sampling each signal of the first set of at least one signal over the sample interval that trails the first synthetic sampling time; and
sampling each signal of the second set of at least one signal over the sample interval that trails the second synthetic sampling time occurs after sampling each signal of the first set of at least one signal over the sample interval that trails the first synthetic sampling time.

31. A method for determining a position of a read head relative to a scale member, the read head and scale having at least a first set of transducer elements and a second set of transducer elements formed thereon, each of the first and second sets of transducer elements generating first and second sets of at least one signal based on the relative position of the read head and the scale member, the method comprising:
- determining a first sampling time for the first set of transducer elements;
- determining a second sampling time for the second set of transducer elements, where the second sampling time trails the first sampling time by a sample offset period;
- determining a third sampling time for the first set of transducer elements, where the third sampling time trails the second sampling time by the sample offset period;
- determining the position of the read head relative to the scale member for the first set of transducer elements for each of the first and third sampling times;
- determining the position of the read head relative to the scale member for the second set of transducer elements for the second sampling time; and
- determining the position of the read head relative to the scale member for the first set of transducer elements for the second sampling time based on the determined positions of the read head relative to the scale member for the first set of transducer elements for each of the first and third sampling times.

32. The method of claim 31, wherein determining the position of the read head relative to the scale member for the first set of transducer elements for the first sampling time comprises:
- sampling each signal of the first set of at least one signal over a sample interval that precedes the first sampling time by a corresponding preceding offset period to generate a preceding signal sample of each signal of the first set of at least one signal;
- sampling each signal of the first set over a sample interval that trails the first sampling time by a corresponding trailing offset period to generate a trailing signal sample of each signal of the first set of at least one signal;
- combining, for each signal of the first set of at least one signal, the preceding and trailing signal samples of that signal into a synthetic sample corresponding to the first sampling time; and
- determining the position of the read head relative to the scale member for the first set of transducer elements at the first sampling time based on the at least one synthetic sample of the first set of at least one signal.

33. The method of claim 31, wherein determining the position of the read head relative to the scale member for the first set of transducer elements for the third sampling time comprises:
- sampling each signal of the first set of at least one signal over a sample interval that precedes the third sampling time by a corresponding preceding offset period to generate a preceding signal sample of each signal of the first set of at least one signal;
- sampling each signal of the first set over a sample interval that trails the third sampling time by a corresponding trailing offset period to generate a trailing signal sample of each signal of the first set of at least one signal;
- combining, for each signal of the first set of at least one signal, the preceding and trailing signal samples of that signal into a synthetic sample corresponding to the third sampling time; and
- determining the position of the read head relative to the scale member for the first set of transducer elements at the third sampling time based on the at least one synthetic sample of the first set of at least one signal.

34. The method of claim 31, wherein determining the position of the read head relative to the scale member for the second set of transducer elements for the second sampling time comprises:
- sampling each signal of the second set of at least one signal over a sample interval that precedes the second sampling time by a corresponding preceding offset period to generate a preceding signal sample of each signal of the second set of at least one signal;
- sampling each signal of the second set of at least one over a sample interval that trails the second sampling time by a corresponding trailing offset period to generate a trailing signal sample of each signal of the second set of at least one signal;
- combining, for each signal of the second set of at least one signal, the preceding and trailing signal samples of that signal into a synthetic sample corresponding to the second sampling time; and
- determining the position of the read head relative to the scale member for the second set of transducer elements at the second sampling time based on the at least one synthetic sample of the second set of at least one signal.

35. The method of claim 31, further comprising:
- determining a fourth sampling time for the second set of transducer elements, where the fourth sampling time trails the third sampling time by the sample offset period;
- determining the position of the read head relative to the scale member for the second set of transducer elements for the fourth sampling time; and
- determining the position of the read head relative to the scale member for the second set of transducer elements for the third sampling time based on the determined positions of the read head relative to the scale member for the second set of transducer elements for each of the second and fourth sampling times.

36. The method of claim 35, wherein determining the position of the read head relative to the scale member for the second set of transducer elements for the fourth sampling time comprises:
- sampling each signal of the second set of at least one signal over a sample interval that precedes the fourth sampling time by a corresponding preceding offset period to generate a preceding signal sample of each signal of the second set of at least one signal;
- sampling each signal of the second set of at least one over a sample interval that trails the fourth sampling time by a corresponding trailing offset period to generate a trailing signal sample of each signal of the second set of at least one signal;
- combining, for each signal of the second set of at least one signal, the preceding and trailing signal samples of that signal into a synthetic sample corresponding to the fourth sampling time; and
- determining the position of the read head relative to the scale member for the second set of transducer elements at the fourth sampling time based on the at least one synthetic sample of the second set of at least one signal.

37. The method of claim 31, further comprising:
- determining at least one additional sampling time; and
- repeating appropriate ones of the determining steps for each additional sampling time.

38. The method of claim 31, wherein for each of the first, second and third sampling times, determining the position of the read head relative to the scale member for the first or second set of transducer elements for the that sampling time comprises:

sampling each signal of the first set of at least one signal over a sample interval that precedes the first sampling time by a corresponding preceding offset period to generate a preceding signal sample of each signal of the first set of at least one signal;

sampling each signal of the first set over a sample interval that trails the first sampling time by the corresponding trailing offset period to generate a trailing signal sample of each signal of the first set of at least one signal;

combining, for each signal of the first set of at least one signal, the preceding and trailing signal samples of that signal into a synthetic sample corresponding to the first sampling time; and determining the position of the read head relative to the scale member for the first set of transducer elements at the first sampling time based on the at least one synthetic sample of the first set of at least one signal.

39. The method of claim 31, wherein:

the first set of at least one signal comprises a plurality of signals; and the corresponding preceding and trailing offset periods for each of the plurality of signals of the first set are different from the corresponding preceding and trailing offset periods for each other signal of the first set.

40. The method of claim 39, wherein:

determining the at least one additional synthetic sampling time comprises determining a next synthetic sampling time based on the previous synthetic sampling time and the corresponding different preceding and trailing offset periods of the plurality of signals of the first set such that the lagging sampling interval for each of the plurality of signals of the first set corresponding to the previous synthetic sample precedes the next synthetic sampling period by a second corresponding preceding offset period; and repeating the sampling steps and the combining and determining steps for the next synthetic sampling time comprises:

sampling each signal of the plurality of signals of the first set over a lagging sample interval that trails the next synthetic sampling time by a second corresponding trailing offset period to generate a trailing signal sample of each of the plurality of signals of the first set;

combining, for each signal of the plurality of signals of the first set, the trailing signal sample of that signal for the previous synthetic sampling time and the trailing signal sample of that signal for the next synthetic sampling time into a next synthetic sample corresponding to the next synthetic sampling time; and determining the position of the read head relative to the scale member for the first set of transducer elements at the next synthetic sampling time based on the at least one next synthetic sample of the first set.

41. The method of claim 40, wherein, for each of the plurality of signals, the second corresponding preceding and trailing offset periods are equal to the corresponding preceding and trailing offset periods.

42. The method of claim 31, wherein:

sampling each signal of the second set of at least one signal over the sample interval that precedes the second synthetic sampling time occurs after sampling each signal of the first set of at least one signal over the sample interval that precedes the first synthetic sampling time and before sampling each signal of the first set of at least one signal over the sample interval that trails the first synthetic sampling time; and sampling each signal of the second set of at least one signal over the sample interval that trails the second synthetic sampling time occurs after sampling each signal of the first set of at least one signal over the sample interval that trails the first synthetic sampling time.

43. A method for precisely sampling S measurement signals in a dynamic environment to achieve an accurate measurement position corresponding to a particular measurement time, comprising:

sampling each of S measurement signals during a predetermined sampling period such that a first signal from one subset of measurement elements is sampled at a first time, a second signal from a second subset of measurement elements is sampled at a second time, and so on until all S signals have been sampled, sampling the measurement signals in reverse order such that the first signal S to be sampled is also the last signal to be sampled;

averaging the sampled signals; and outputting a precision measurement based on the average of the sampled signals corresponding to a time coinciding with one-half of the sampling interval between the first and last signal samplings.

* * * * *